(12) United States Patent
Takemasa et al.

(10) Patent No.: US 7,571,647 B2
(45) Date of Patent: Aug. 11, 2009

(54) PACKAGE STRUCTURE FOR AN ACCELERATION SENSOR

(75) Inventors: Kengo Takemasa, Miyazaki (JP); Fumihiko Ooka, Miyazaki (JP)

(73) Assignee: Oki Semiconductor Co., Ltd., Tokyo (JP)

(*) Notice: Subject to any disclaimer, the term of this patent is extended or adjusted under 35 U.S.C. 154(b) by 216 days.

(21) Appl. No.: 11/213,982

(22) Filed: Aug. 30, 2005

(65) Prior Publication Data
US 2007/0044557 A1 Mar. 1, 2007

(51) Int. Cl.
*G01P 1/02* (2006.01)
(52) U.S. Cl. .................................................... 73/493
(58) Field of Classification Search ........... 73/493, 73/431, 514.33, 514.29, 514.32, 862.381
See application file for complete search history.

(56) References Cited

U.S. PATENT DOCUMENTS

| | | | | |
|---|---|---|---|---|
| 5,493,106 A | * | 2/1996 | Hunter | 235/375 |
| 5,963,782 A | * | 10/1999 | Webb | 438/15 |
| 5,994,161 A | * | 11/1999 | Bitko et al. | 438/53 |
| 6,201,285 B1 | * | 3/2001 | Iwata et al. | 257/419 |
| 6,448,624 B1 | * | 9/2002 | Ishio et al. | 257/417 |
| 6,744,636 B2 | * | 6/2004 | Knowles | 361/767 |
| 6,836,010 B2 | * | 12/2004 | Saeki | 257/694 |
| 6,979,873 B2 | * | 12/2005 | Fujii | 257/417 |
| 7,249,509 B2 | * | 7/2007 | Hirano | 73/504.12 |
| 7,339,265 B2 | * | 3/2008 | Kitao et al. | 257/690 |
| 2001/0055836 A1 | * | 12/2001 | Kunda | 438/108 |
| 2003/0177831 A1 | * | 9/2003 | Ikezawa et al. | 73/514.16 |

FOREIGN PATENT DOCUMENTS

| | | |
|---|---|---|
| JP | 06-160423 | 6/1994 |
| JP | 06-289048 | 10/1994 |
| JP | 2004-056023 | 2/2004 |

* cited by examiner

*Primary Examiner*—Helen C. Kwok
(74) *Attorney, Agent, or Firm*—Rabin & Berdo, PC (57) ABSTRACT

According to the present invention, a package for an acceleration sensor, includes an acceleration sensor which is proved with a first terminal; a package base; an adhesive layer provided on the package base; and a spacer provided between the adhesive layer and the acceleration sensor. The spacer comprises a second terminal, which is electrically coupled to the first terminal of the acceleration sensor.

21 Claims, 8 Drawing Sheets

PACKAGE STRUCTURE FOR AN ACCELERATION SENSOR

TECHNICAL FIELD OF THE INVENTION

The present invention relates generally to a packaging structure for a sensor detecting physical movement. More particularly, the present invention relates to a packaging structure for a three-dimensional acceleration sensor (accelerometer) using MEMS (Micro Electro mechanical Systems) technology, which detects physical movement of a movable mass.

BACKGROUND OF THE INVENTION

According to a type of accelerometer using a piezoresistive effect, may include a box shape of seismic mass (i.e. movable mass), contained in a cavity of a silicon base member. The movable mass is suspended by beams on which a piezoresistance are formed, so that a stress is applied to the piezoresistance in response to movement of the movable mass. The variation of stress applied to the piezoresistance is detected as a variation of resistance.

Such an accelerometer is designed to be contained in a ceramic package and the package is mounted on a circuit board. A conventional accelerometer is fixed onto an inner bottom of a ceramic package with a resin adhesive to improve shock resistant. However, the resin adhesive generally has a higher coefficient of thermal expansion, so that the piezoresistances is difficult to operate properly and stably when the temperature change occurs.

OBJECTS OF THE INVENTION

Accordingly, an object of the present invention is to provide a package structure for an acceleration sensor that operates stably in a wider range of temperature.

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to a first aspect of the present invention, a package for an acceleration sensor, includes an acceleration sensor which is proved with a first terminal; a package base; an adhesive layer provided on the package base; and a spacer provided between the adhesive layer and the acceleration sensor. The spacer comprises a second terminal, which is electrically coupled to the first terminal of the acceleration sensor.

The package base may be made of ceramics. The adhesive layer may be made of a resin having a low coefficient of elasticity, which is lower than 100 MPa. The spacer may be a semiconductor device having a wiring pattern thereon, such as a LSI chip. The acceleration sensor may include a movable mass and a detecting element, which electrically detects a physical movement of the mass, and the detecting element is connected to the first terminal. Preferably, the detecting element and the terminal are arranged at a side facing the spacer. In other words, the acceleration sensor may be mounted in a package by a face-down bonding technique.

The detecting element may be a piezoresistances to which a stress is applied in response to movement of the movable mass, in which variation of stress is detected as a variation of resistance.

Preferably, the package according to the present invention further includes an external terminal, which is electrically coupled to the second terminal of the spacer and to an external circuit, which is usually formed on a circuit board. The external terminal and the second terminal of the spacer may be wire-bonded to each other in the package.

According to a second aspect of the present invention, a package for an acceleration sensor further includes a conductive bump, which electrically connects the first terminal of the acceleration sensor and the second terminal of the spacer.

DETAILED DISCLOSURE OF THE INVENTION

In the following detailed description of the preferred embodiments, reference is made to the accompanying drawings which form a part hereof, and in which is shown by way of illustration specific preferred embodiments in which the inventions may be practiced. These preferred embodiments are described in sufficient detail to enable those skilled in the art to practice the invention, and it is to be understood that other preferred embodiments may be utilized and that logical, mechanical and electrical changes may be made without departing from the spirit and scope of the present inventions. The following detailed description is, therefore, not to be taken in a limiting sense, and scope of the present inventions is defined only by the appended claims.

Figure 1:
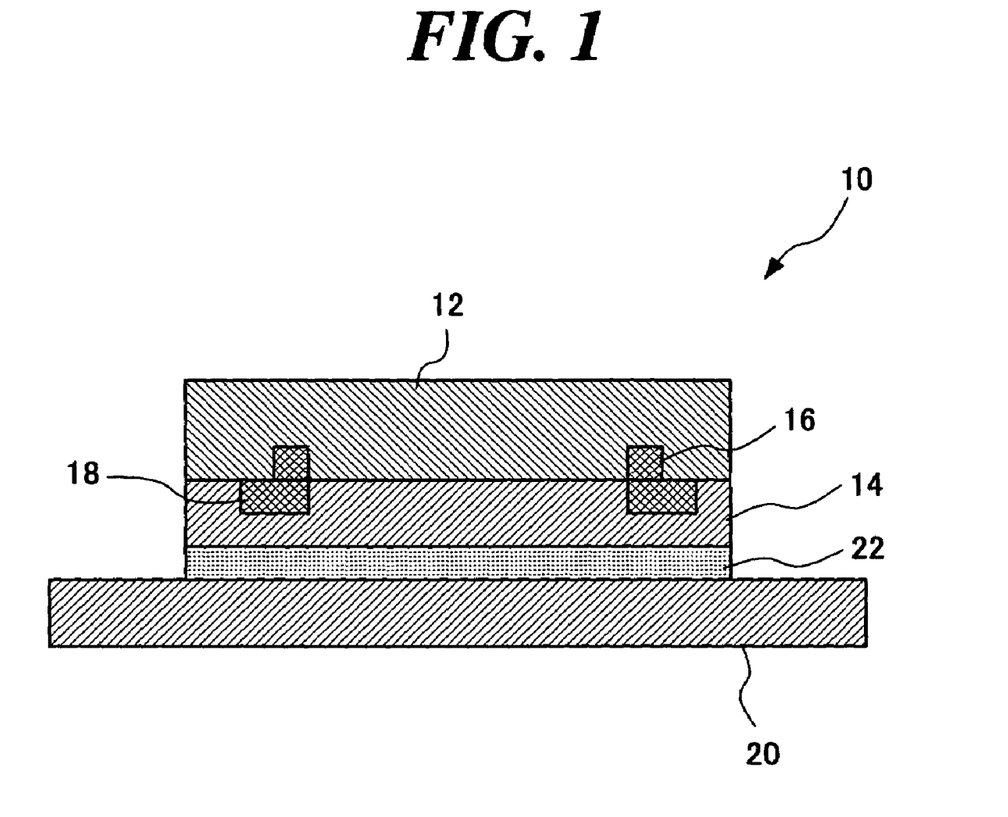
FIG. 1 is a cross-sectional view illustrating overview of a package structure for a three-dimensional acceleration sensor according to the present invention.

Referring to FIG. 1, a package structure 10 for a three-dimensional acceleration sensor according to the present invention includes an acceleration sensor 12 which is proved with a first terminal 16; a package base 20; an adhesive layer 22 provided on the package base 20; and a spacer 14 provided between the adhesive layer 22 and the acceleration sensor 12. The spacer 14 includes a second terminal 18, which is electrically coupled to the first terminal 16 of the acceleration sensor 12.

The acceleration sensor 12 may be a variety of types, including three-dimensional acceleration sensor used in a mobile phone, a computer and the like. The package base 20 may be a bottom of a box-shaped package, made of ceramics such as alumina and alumina nitride. The first and second terminals 16 and 18 may be made of aluminum (Al), copper (Cu) or the like.

The spacer 14 may be a layer or device functioning to prevent thermal deformation, which may be transferred from the adhesive layer 22 toward the acceleration sensor 12. The spacer 14 may be made of silicon having no wiring pattern thereon. The spacer 14 also may be a semiconductor device such as a LSI chip having a specific wiring pattern thereon. The spacer 14 may be shaped to have a thickness of 100 to 150 µm.

The adhesive layer 22 has a function to absorb physical shock or impact, which forwards to the acceleration sensor 12. Preferably, the adhesive layer 22 may be made of a resin having a low coefficient of elasticity, which is lower than 100 MPa or 10 to 100 MPa. The adhesive layer 22 may be made of silicon, Ag (silver) paste, insulation paste, insulation film and the like. The adhesive layer 22 may be formed to have a thickness of 20 to 30 µm.

The acceleration sensor 12 may include a movable mass and a detecting element, which electrically detects a physical movement of the mass, and the detecting element is connected to the first terminal 16. Preferably, the detecting element and the first terminal 16 are arranged at a side facing the spacer 14. The detecting elements may be piezoresistances to which a stress is applied in response to movement of the movable mass, in which variation of stress is detected as a variation of resistance. The acceleration sensor 12 may be shaped to have a thickness of 300 to 360 µm.

Preferably, the package according to the present invention further includes an external terminal, which is electrically coupled to the second terminal 18 of the spacer 14 and to an external circuit, which is usually formed on a circuit board. The external terminal and the second terminal 18 of the spacer 14 may be wire-bonded to each other within the package 10.

Figure 2:
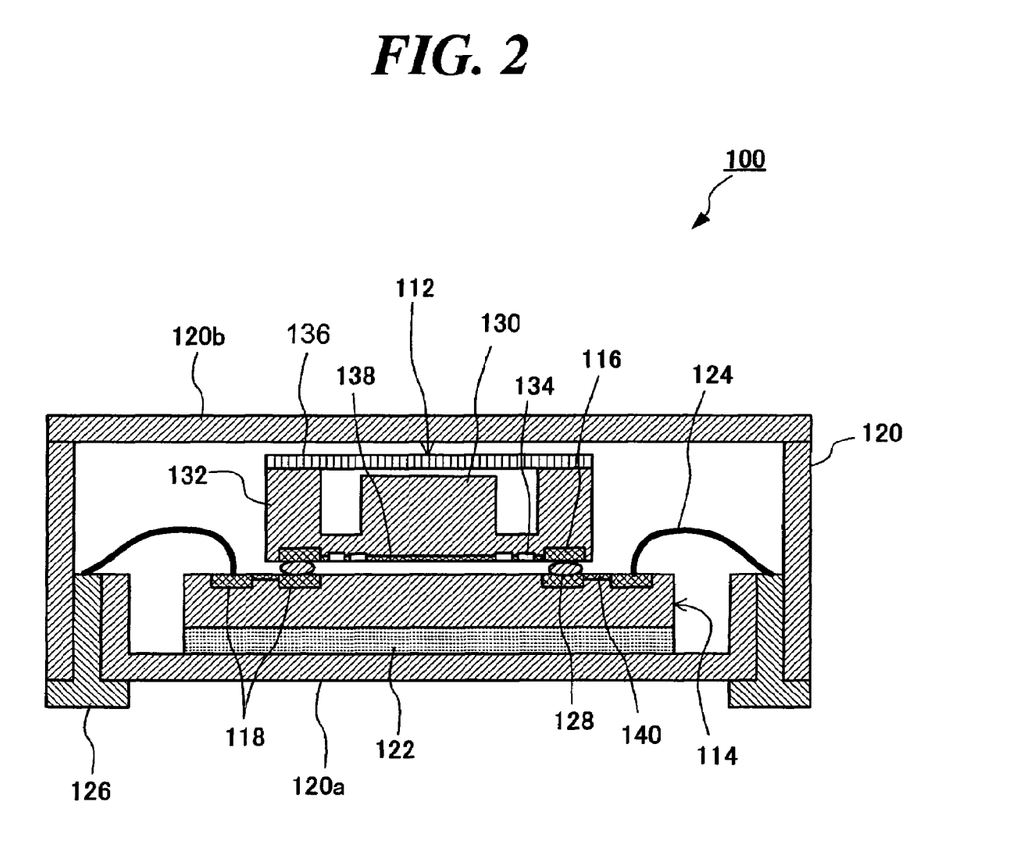
FIG. 2 is a cross-sectional view illustrating a package structure for a three-dimensional acceleration sensor according to a preferred embodiment of the present invention.
Figure 3:
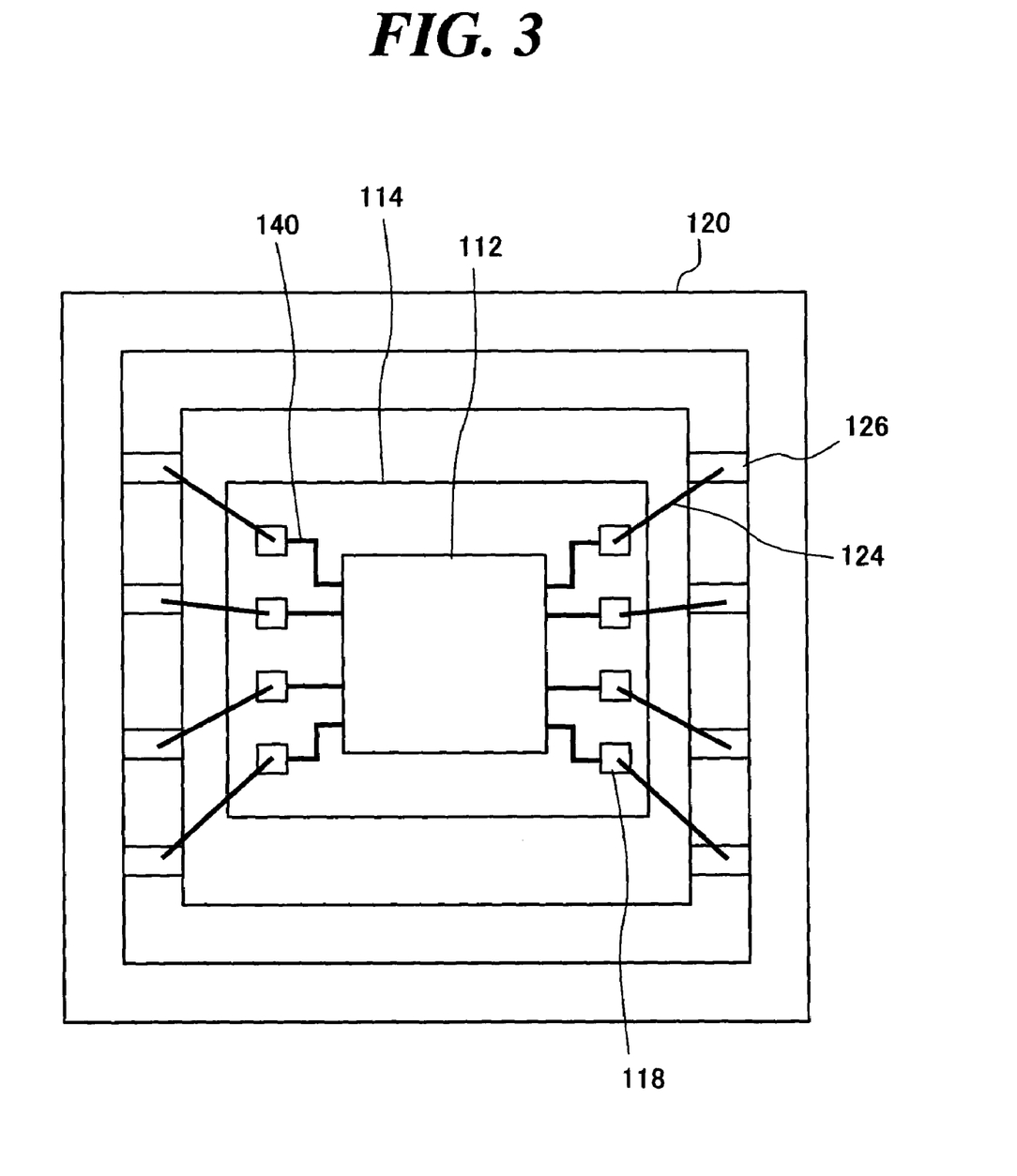
FIG. 3 is a plane view illustrating overview of the package structure, shown in FIG. 2.
Figure 4:
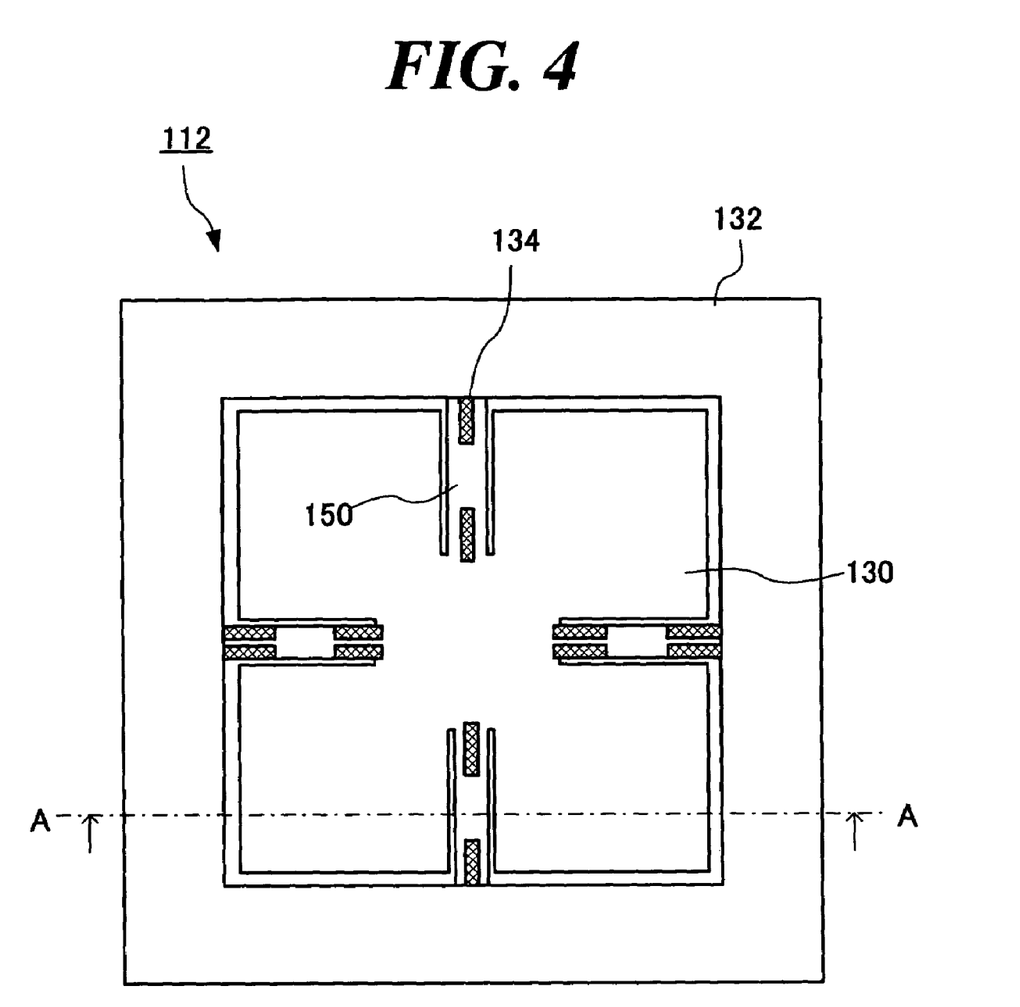
FIG. 4 is a plane view illustrating a three-dimensional acceleration sensor employed in the package structure, shown in FIGS. 2 and 3.
Figure 5:
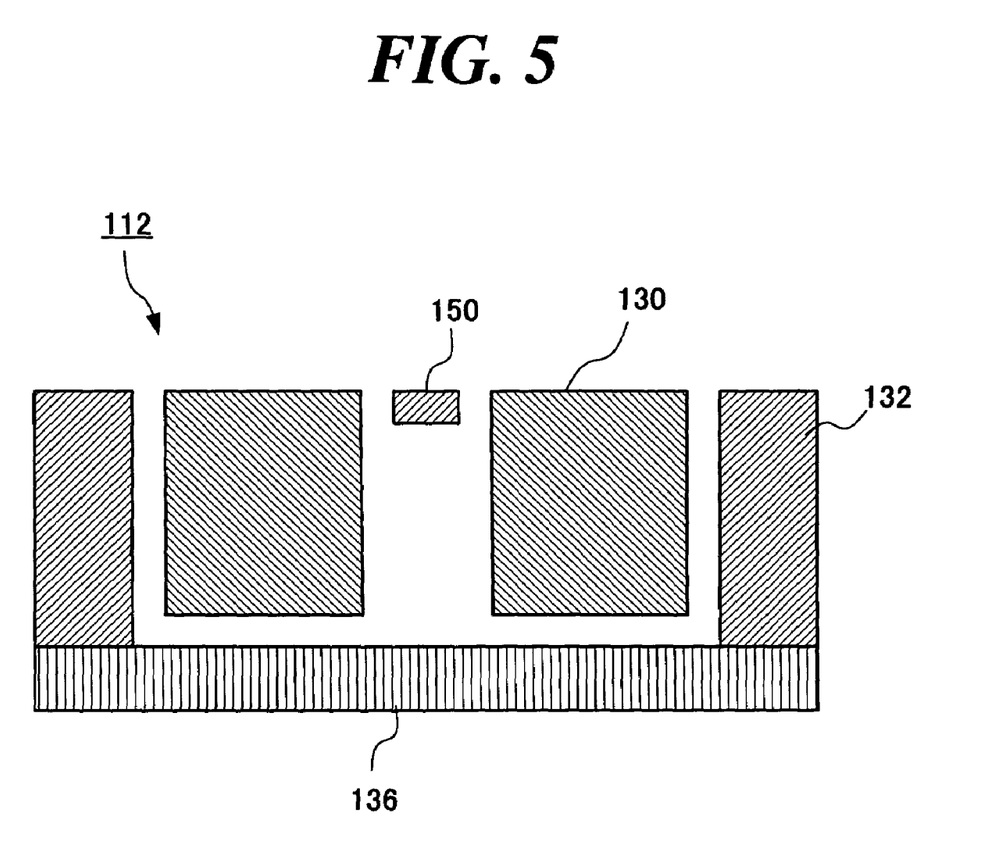
FIG. 5 is a cross-sectional view taken on line A-A in FIG. 4.

FIG. 2 is a cross-sectional view illustrating a package structure 100 for a three-dimensional acceleration sensor according to a preferred embodiment of the present invention. FIG. 3 is a plane view illustrating overview of the package structure 100, shown in FIG. 2. FIG. 4 is a plane view illustrating a three-dimensional acceleration sensor 112 employed in the package structure 100, shown in FIGS. 2 and 3. FIG. 5 is a cross-sectional view taken on line A-A in FIG. 4. In FIG. 2, a top cover of an outer package is not shown for better understanding of the interior of the package 100.

First, referring to FIGS. 2 and 3, the package structure 100 includes a three-dimensional acceleration sensor 112 which is proved with first terminals 116; a ceramic package 120 having a package base 120a and a package top 120b; an adhesive layer 122 provided on the package base 120a; and a spacer 114 provided between the adhesive layer 122 and the three-dimensional acceleration sensor 112. The first terminals 116 are inlaid within the three-dimensional acceleration sensor 112 such that a surface of each first terminal 116 is substantially coplanar with a surface of the three-dimensional acceleration sensor 112. The spacer 114 includes second terminals 118, which are electrically coupled to the first terminals 116 of the three-dimensional acceleration sensor 112. The second terminals 118 are inlaid within the spacer 114 such that a surface of each second terminal 118 is substantially coplanar with a surface of the spacer 114.

The package 120 includes external terminals 126, which are electrically coupled to the second terminals 118 of the spacer 114 and to an external circuit, for example a wiring formed on a circuit board. The external terminals 126 and the second terminals 118 of the spacer 114 are wire-bonded to each other within the package 120.

The first terminals 116 of the acceleration sensor 112 and the second terminals 118 of the spacer 114 are connected with bumps 128, which may be made of solder (SnPb, AuSn) or gold (Au). Each of the bumps 128 may have a height or thickness of 10 to 50 µm.

The three-dimensional acceleration sensor 112 is shaped to be square, as shown in FIG. 3, and is fabricated using MEMS (Micro Electro mechanical Systems) technology. The acceleration sensor 112 is designed to detect physical movement of a movable mass (seismic mass) 130 using a piezoresistive effect. The acceleration sensor 112 can be used for detecting acceleration, vibration, angle of inclination and so on.

Now referring also to FIGS. 4 and 5, the acceleration sensor 112 includes a stationary frame 132, a movable mass 130, a pyrex glass plate 136, beams 150 and piezoresistances 134. The pyrex glass plate 136 is arranged on the top of the sensor 112 in FIG. 2 when the package structure 100 is completely fabricate. The movable mass 130 is shaped to be a box and is contained in a cavity of a silicon base member (stationary frame 132). The movable mass 130 is suspended by beams 150 on which the piezoresistances 134 are formed, so that a stress is applied to the piezoresistances 134 in response to movement of the movable mass 130. The variation of stress applied to the piezoresistances 134 is detected as a variation of resistance.

The acceleration sensor 112 may be used in a mobile phone, a computer and the like. The package 120 may be made of ceramics such as alumina and alumina nitride. The first and second terminals 116 and 118 may be pads made of aluminum (Al), copper (Cu) or the like. A wiring pattern 138 is formed on a lower surface of the three-dimensional acceleration sensor 112. The wiring pattern 138 is electrically connected to the first terminals 116.

The piezoresistances 134 are electrically connected to the first terminals 116 via the wiring pattern 138. The piezoresistances 134 and the first terminals 116 are arranged at the lower surface of the sensor 112 to face an upper surface of the spacer 114. The acceleration sensor 112 may be shaped to have a thickness of 300 to 360 µm.

The spacer 114 is a layer having a function preventing thermal deformation, which may be transferred from the adhesive layer 122 toward the acceleration sensor 112. The spacer 114 is a semiconductor device such as a LSI chip having a specific wiring pattern 140 thereon. The spacer 114 may be shaped to have a thickness of 100 to 150 µm.

The adhesive layer 122 has a function to absorb physical shock or impact, which forwards to the acceleration sensor 112. Preferably, the adhesive layer 122 may be made of a resin having a low coefficient of elasticity, which is lower than 100 MPa or 10 to 100 MPa. The adhesive layer 122 may be made of silicon, Ag (silver) paste, insulation paste, insulation film and the like. The adhesive layer 122 may be formed to have a thickness of 20 to 30 µm.

Figure 6A:
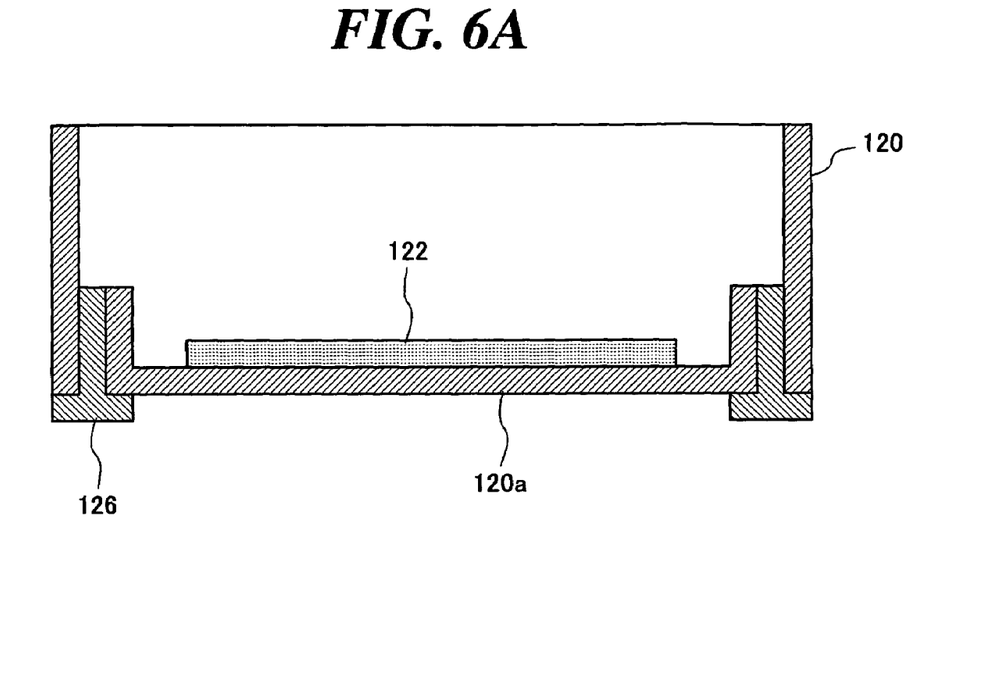
FIGS. 6A-6F are cross-sectional views illustrating fabrication steps of the package structure, shown in FIG. 2.
Figure 6B:
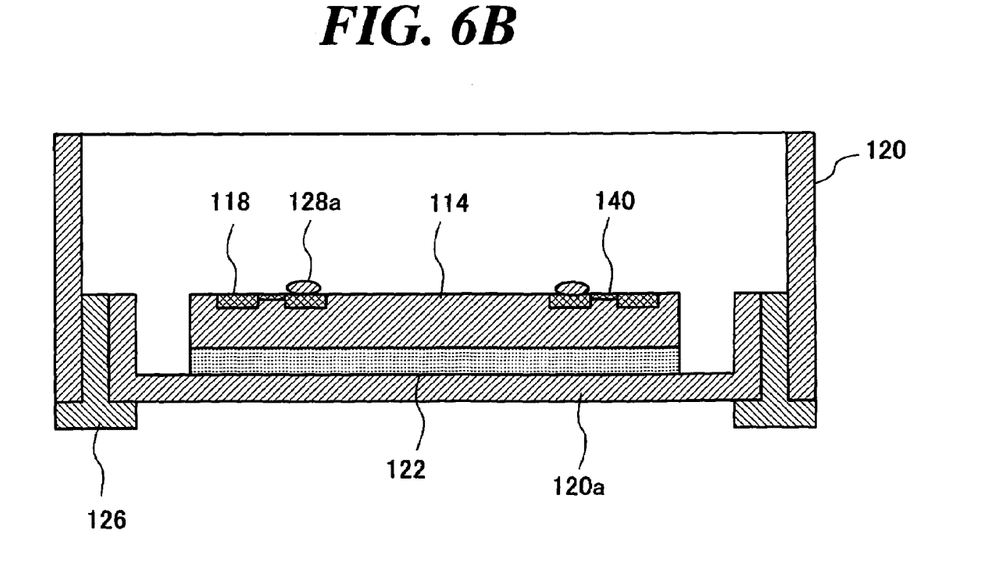

Now, referring to FIGS. 6A-6F, fabrication steps of the package structure 100, shown in FIG. 2, will be described as follows:

First, referring to FIG. 6A, an adhesive resin is coated on an upper surface of the package bottom 120a to form the adhesive layer 122. The spacer 114 is prepared and conductive bumps 128a are provided on the second terminals (aluminum pads) 118. Thus prepared spacer 114 is put on the adhesive layer 122, as shown in FIG. 6B. After that, the adhesive layer 122 is hardened.

Next, the acceleration sensor 112 is fabricated and conductive bumps 128b are provided on the first terminals (aluminum pads) 116 in a wafer-level processing. The acceleration sensor 112 may be fabricated in the upside down direction from that shown in FIGS. 2 and 6C, in which the glass plate 136 is provided at the bottom of the sensor 112.

Figure 6C:
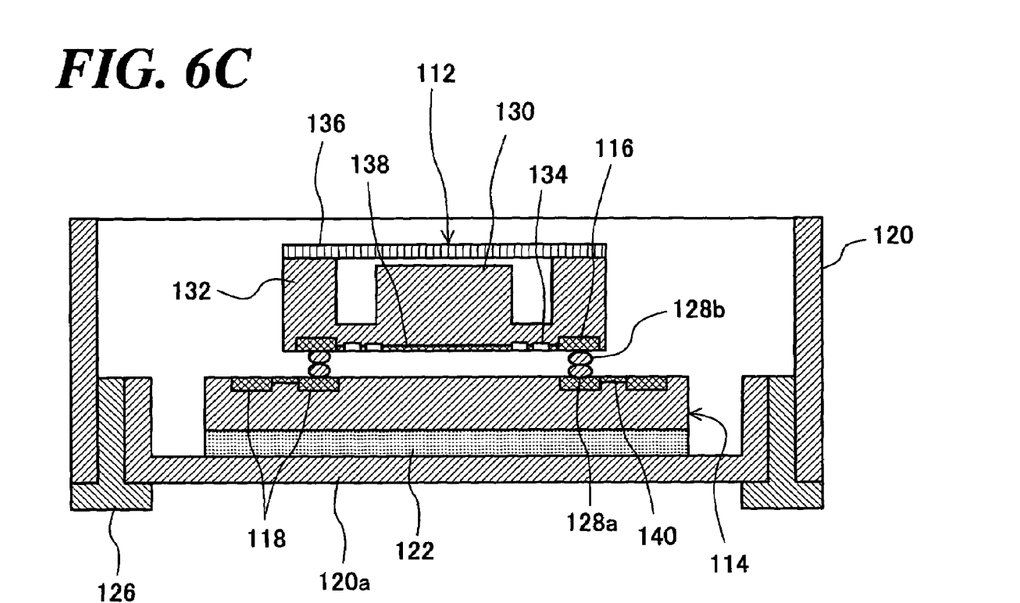

The acceleration sensor 112 is mounted on the spacer 114 so that the conductive bumps 128a and 128b are laid on top of the other, as shown in FIG. 6C. If the conductive bumps 128a and 128b are both made of Au (gold), those bumps 128a and 128b would be bonded or fixed to each other by ultrasonic mounting method or heating-and-pressurizing method. If at least one of the conductive bumps 128a and 128b is made of solder (SnPb, AuSn), a fluxing process, a reflow process (heating) and a flux cleaning process would be carried out.

Figure 6D:
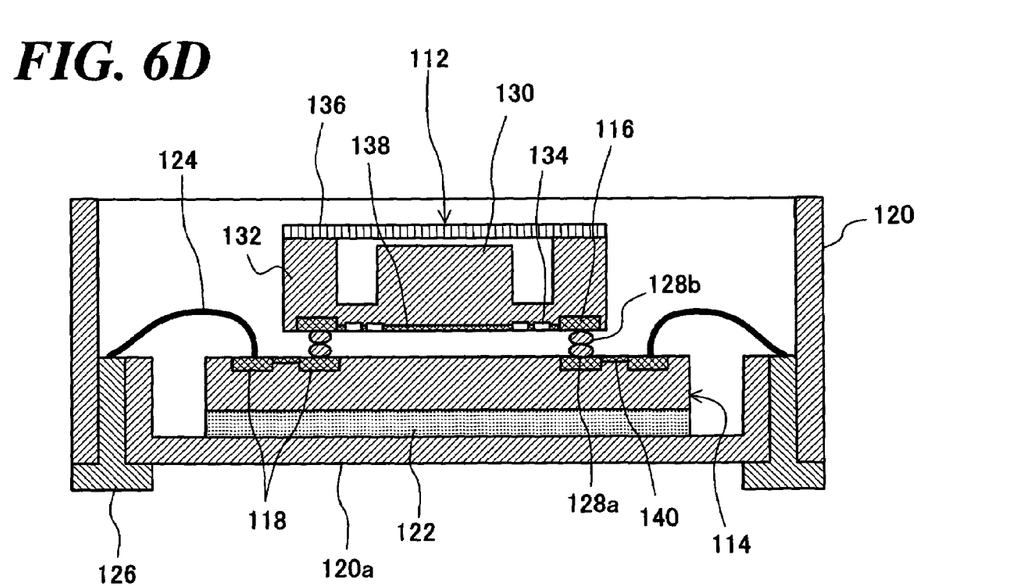
Figure 6E:
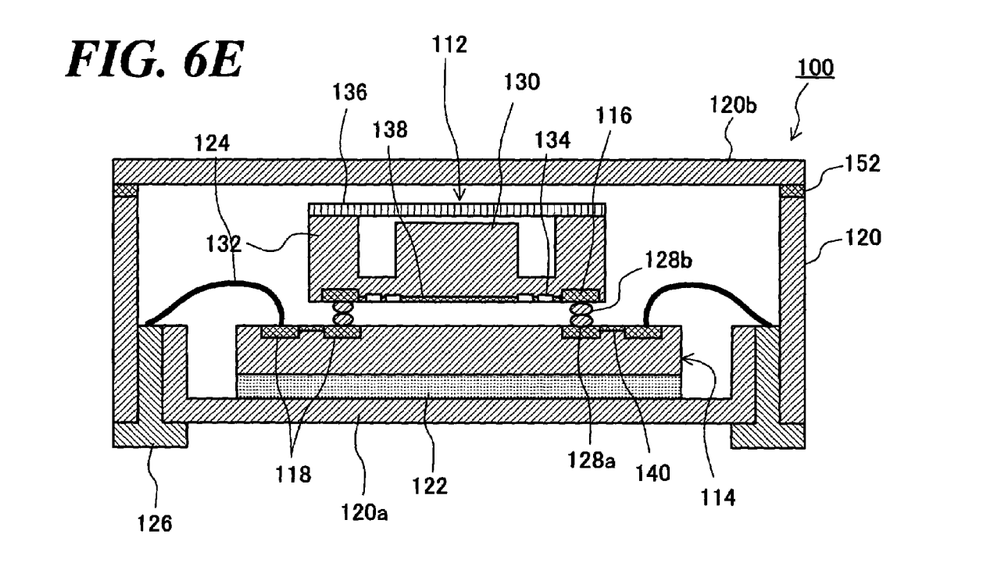

Subsequently, referring to FIG. 6D, the second terminals 118 which are located outer most region of the spacer 114 are wire-bonded to the external terminals 126. Next, as shown in FIG. 6E, the package top 120b is put on the package body 120 to seal the package 120. The package top 120b is sealed with a sealing material 152 such as an epoxy resin and a solder, so that the package structure 100 is completed. The package top 120b may be made of ceramics, glass or metal. If the sealing material 152 is made of an epoxy resin, the sealing material 152 would be hardened for seal. If the sealing material 152 is made of a solder, the sealing material 152 would be reflow-bonded for seal.

Figure 6F:
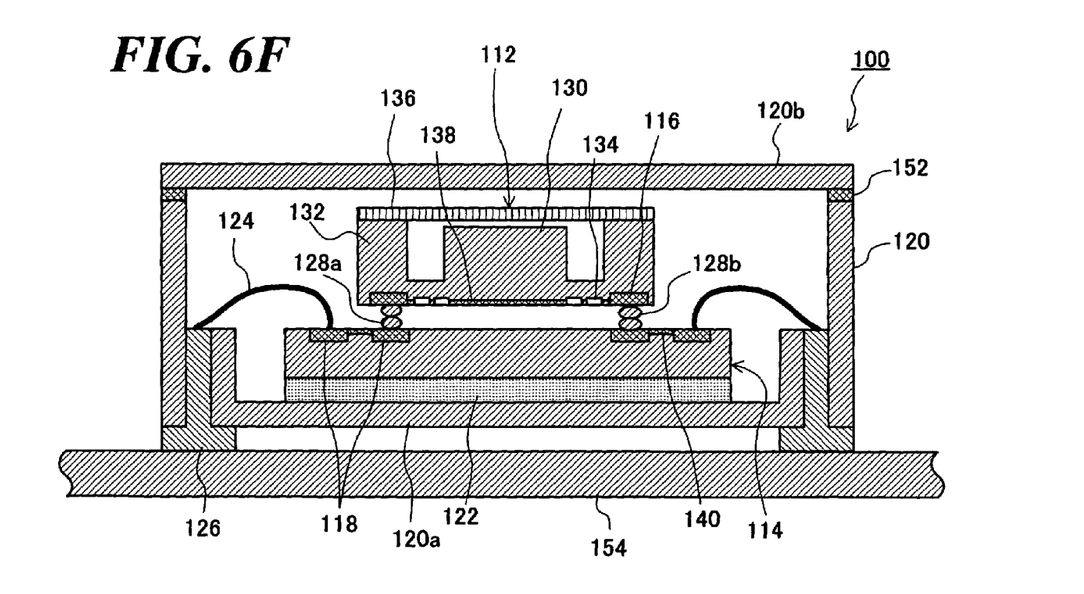

After that, as shown in FIG. 6F, the package structure 100 is mounted on a circuit board 154 by a solder mounting method. The external terminals 126 are electrically connected to a wiring formed on the circuit board 154.

What is claimed is:

1. A package for an acceleration sensor, comprising:
   an acceleration sensor which is provided with at least one first terminal, the at least one first terminal is inlaid within the acceleration sensor such that a surface of the at least one first terminal is substantially coplanar with a surface of the acceleration sensor;
   a package base;
   an adhesive layer provided on the package base, wherein the adhesive layer has a thickness of about 20 µm to about 30 µm, and is made of a resin having a low coefficient of elasticity, which is between about 10 MPa to about 100 MPa; and
   a spacer provided between the adhesive layer and the acceleration sensor, wherein a width of the adhesive layer is substantially similar to a width of the spacer such that the adhesive layer facilitates absorbing physical shocks transferred from the package base to the acceleration sensor, and wherein the spacer comprises at least one second terminal, which is electrically coupled to the first terminal of the acceleration sensor, the at least one second terminal is inlaid within the spacer such that a surface of the at least one second terminal is substantially coplanar with a surface of the spacer.

2. A package for an acceleration sensor according to claim 1, wherein
   the package base is made of ceramics.

3. A package for an acceleration sensor according to claim 1, wherein
   the spacer is a semiconductor device having a wiring pattern thereon.

4. A package for an acceleration sensor according to claim 1, wherein
   the spacer is a LSI chip having a functional circuit therein.

5. A package for an acceleration sensor according to claim 1, wherein
   the acceleration sensor comprises a movable mass and a detecting element, which electrically detects a physical movement of the mass, and wherein
   the detecting element is connected to the first terminal.

6. A package for an acceleration sensor according to claim 1, wherein
   the first terminal is arranged at a side facing the spacer.

7. A package for an acceleration sensor according to claim 5, wherein
   the detecting element and the first terminal are arranged at a side facing the spacer.

8. A package for an acceleration sensor according to claim 5, where in
   the detecting element is a piezoresistances to which a stress is applied in response to movement of the movable mass, in which variation of stress is detected as a variation of resistance.

9. A package for an acceleration sensor according to claim 1, further comprising:
   an external terminal, which is electrically coupled to the second terminal of the spacer and to an external circuit.

10. A package for an acceleration sensor according to claim 9, wherein
    the external terminal and the second terminal of the spacer are wire-bonded to each other in the package.

11. A package for an acceleration sensor according to claim 1, further comprising:
    a conductive bump, which electrically connects the first terminal of the acceleration sensor and the second terminal of the spacer.

12. A package for an acceleration sensor according to claim 11, wherein
    the package base is made of ceramics.

13. A package for an acceleration sensor according to claim 11, wherein
    the adhesive layer is made of a resin having a low coefficient of elasticity, which is lower than 100 MPa.

14. A package for an acceleration sensor according to claim 11, wherein
    the spacer is a semiconductor device having a wiring pattern thereon.

15. A package for an acceleration sensor according to claim 11, wherein
    the spacer is a LSI chip having a functional circuit therein.

16. A package for an acceleration sensor according to claim 11, wherein
    the acceleration sensor comprises a movable mass and a detecting element, which electrically detects a physical movement of the mass, and wherein the detecting element is connected to the first terminal.

17. A package for an acceleration sensor according to claim 11, wherein
    the first terminal is arranged at a side facing the spacer.

18. A package for an acceleration sensor according to claim 16, wherein
    the detecting element and the first terminal are arranged at a side facing the spacer.

19. A package for an acceleration sensor according to claim 16, wherein
    the detecting element is a piezoresistances to which a stress is applied in response to movement of the movable mass, in which variation of stress is detected as a variation of resistance.

20. A package for an acceleration sensor according to claim 11, further comprising:
    an external terminal, which is electrically coupled to the second terminal of the spacer and to an external circuit.

21. A package for an acceleration sensor according to claim 20, wherein
    the external terminal and the second terminal of the spacer are wire-bonded to each other in the package.

* * * * *